(12) United States Patent
Guo et al.

(10) Patent No.: US 8,841,193 B2
(45) Date of Patent: Sep. 23, 2014

(54) SEMICONDUCTOR STRUCTURE AND METHOD FOR SLIMMING SPACER

(71) Applicant: United Microelectronics Corp., Hsin-Chu (TW)

(72) Inventors: Ted Ming-Lang Guo, Tainan (TW); Chin-Cheng Chien, Tainan (TW); Shu-Yen Chan, Changhua County (TW); Ling-Chun Chou, Yunlin County (TW); Tsung-Hung Chang, Yunlin County (TW); Chun-Yuan Wu, Yunlin County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/928,366

(22) Filed: Jun. 26, 2013

(65) Prior Publication Data
US 2013/0288446 A1 Oct. 31, 2013

Related U.S. Application Data

(62) Division of application No. 13/078,001, filed on Apr. 1, 2011, now Pat. No. 8,502,288.

(51) Int. Cl.
H01L 21/336 (2006.01)
H01L 29/78 (2006.01)
H01L 29/66 (2006.01)

(52) U.S. Cl.
CPC ..... *H01L 29/66477* (2013.01); *H01L 29/66545* (2013.01); *H01L 29/7847* (2013.01); *H01L 29/7843* (2013.01); *H01L 29/6653* (2013.01)
USPC .... 438/303; 438/267; 257/288; 257/E29.242; 257/E21.409; 257/E21.626; 257/E21.64

(58) Field of Classification Search
USPC .................. 438/303, 267; 257/288, E29.242, 257/E21.409, E21.626, E21.64
See application file for complete search history.

(56) References Cited

U.S. PATENT DOCUMENTS

| 7,164,189 | B2 | 1/2007 | Huang |
| 7,314,793 | B2 | 1/2008 | Frohberg |
| 8,110,459 | B2 | 2/2012 | Matsumoto |
| 2005/0130434 | A1 | 6/2005 | Chien |
| 2007/0122958 | A1* | 5/2007 | Fang ............................... 438/197 |
| 2007/0267678 | A1* | 11/2007 | Lo ................................. 257/314 |
| 2011/0223736 | A1 | 9/2011 | Lin |

* cited by examiner

*Primary Examiner* — Timor Karimy
(74) *Attorney, Agent, or Firm* — Winston Hsu; Scott Margo

(57) ABSTRACT

A semiconductor structure including a substrate and a gate structure disposed on the substrate is disclosed. The gate structure includes a gate dielectric layer disposed on the substrate, a gate material layer disposed on the gate dielectric layer and an outer spacer with a rectangular cross section. The top surface of the outer spacer is lower than the top surface of the gate material layer.

13 Claims, 5 Drawing Sheets

SEMICONDUCTOR STRUCTURE AND METHOD FOR SLIMMING SPACER

CROSS REFERENCE TO RELATED APPLICATIONS

This patent application is a divisional application of and claims priority to U.S. patent application Ser. No. 13/078,001, filed on Apr. 1, 2011, and entitled "SEMICONDUCTOR STRUCTURE AND METHOD FOR SLIMMING SPACER" the entire contents of which are incorporated herein by reference.

BACKGROUND OF THE INVENTION

1. Field of the Invention

The present invention generally relates to a semiconductor structure with a slimmed spacer and the method for making the semiconductor structure with the slimmed spacer. In particular, the present invention is directed to a semiconductor structure with a slimmed spacer and the method for making the semiconductor structure with the slimmed spacer.

2. Description of the Prior Art

With the trend of miniaturization of semiconductor device dimensions, for example for the semiconductor processes with the critical dimensionless than 65 nm, the scale of the gate, the source and the drain of a transistor decreases in accordance with the decrease in critical dimension (CD). Due to the intrinsic physical limitation of the materials which are used, the decrease in the scale of the gate, the source and the drain in a transistor, such as a PMOS or an NMOS, results in the decrease of carriers that determine the magnitude of the current in the transistor element, and this can therefore adversely affect the performance of the transistor. As a result, increasing carrier mobility in order to boost up a MOS transistor is an important topic in the field of current semiconductor techniques.

In various current techniques, it is possible to generate a mechanical stress on purpose in the channel to increase the carrier mobility. For example, a silicon germanium (SiGe) channel layer is epitaxially formed on the Si substrate to construct a compressive strained channel to substantially increase the hole mobility. Or alternatively, a silicon channel is epitaxially formed on the germanium (SiGe) layer to construct a tensile strained channel to substantially increase the electron mobility.

In addition, among the current techniques, one of the most popular and well-known methods is to form a corresponding stress therein when a shallow trench isolation, a source, a drain, or a contact etch stop layer (CESL) is formed. For example, the contact etch stop layer (CESL) with a stress turns into a stress layer to provide a gate channel with a compression stress or a tensile stress in order to modify the carrier mobility. For instance, a compression stress is constructed in order to modify the carrier mobility. Generally speaking, the greater the stress is, the higher gain for the carrier mobility is. Accordingly, persons of ordinary skills in the art all endeavor themselves in developing a processing method to pursue a greater stress gain. However, with the trend of miniaturization of semiconductor device dimensions, the stress which is created by the above-mentioned techniques seems to be not enough any more.

Furthermore, during the manufacturing process of semiconductors, a pair of protective and self-aligning spacers is formed to surround the elements of the semiconductor devices, such as the gates. However, when the spacers are formed, some undesirable side effects sometimes occur.

For example, due to the shrinkage of the critical dimension and the increasing integration of elements, the pitch between elements becomes too small to maintain a proper space to accommodate the stress so that the stress layer on the spacers of the adjacent elements merge and the stress in the stress layer cannot be properly delivered to the gate channel. Once the expected tensile or the compressive stress fails, the performance of the elements may deteriorate or fail, too.

Therefore, a novel semiconductor structure and a method for making such semiconductor structure are still needed to create a new way to properly and effective pass the stress in the stress layer to the underlying gate channel as much as possible.

SUMMARY OF THE INVENTION

As a result, the present invention proposes a novel semiconductor device with a slimmed spacer to create a novel semiconductor structure to effectively direct the stress from the stress layer to the gate channel, and a method for making the semiconductor structure with the slimmed spacer in order to direct the stress from the stress layer to the gate channel as much as possible without the substantial adverse influence of the spacer.

The present invention in a first aspect proposes a semiconductor structure. The semiconductor structure of the present invention includes a substrate and a gate structure disposed on the substrate. The gate structure includes a gate dielectric layer, a gate material layer and an outer spacer with a rectangular cross section, a set of source and drain, an interlayer dielectric layer and contact plugs. The gate dielectric layer is disposed on the substrate. The gate material layer is disposed on the gate dielectric layer. The top surface of the outer spacer with a rectangular cross section is lower than the top surface of the gate material layer. In addition, the source and drain are disposed in the substrate and adjacent to the outer spacer. The interlayer dielectric layer covers the substrate, the gate structure and the source and drain. Contact plugs penetrate the interlayer dielectric layer and are respectively electrically connected to the gate structure and the source and drain.

The present invention in a second aspect proposes a method for lowering the height of a spacer. First, a substrate and a gate structure disposed on the substrate are provided. The gate structure includes a gate dielectric layer, a gate material layer and an outer spacer. The gate dielectric layer is disposed on the substrate and the gate material layer is disposed on the gate dielectric layer. In addition, an outer spacer has a sail-like cross section and is adjacent to the gate dielectric layer and the gate material layer. Second, an oxidative slimming procedure is carried out. The oxidative slimming procedure is capable of slimming the height of the outer spacer without substantially slimming the width of the outer spacer so as to make the outer spacer have a rectangular cross section.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
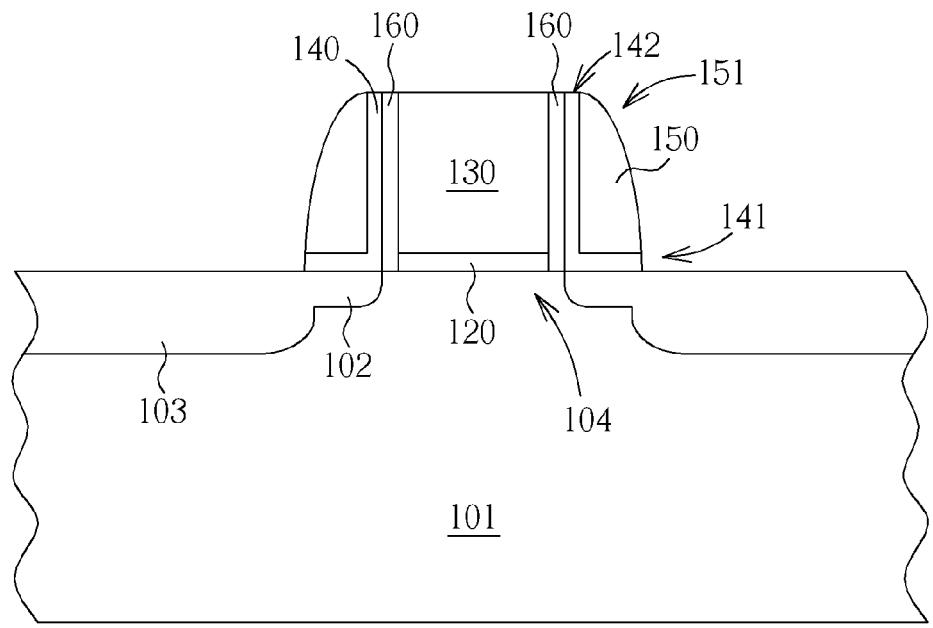
FIGS. 1 to 3B illustrate a method for making the semiconductor structure with the slimmed spacer of the present invention.

The present invention provides a novel semiconductor device with a slimmed spacer to create a novel semiconductor structure to effectively bring the stress from the stress layer to the gate channel as much as possible without the substantial adverse influence of the spacer. The present invention also provides a method for making the semiconductor structure with the slimmed spacer in order to direct the stress from the stress layer to the gate channel as much as possible.

The present invention in a first aspect provides a method for making the semiconductor structure with the slimmed spacer. FIGS. 1 to 4D illustrate various examples of the method for making the semiconductor structure with the slimmed spacer of the present invention. Please refer to FIG. 1, in the method for making the semiconductor structure with the slimmed spacer of the present invention, first a substrate 101 and a gate structure 110 disposed on the substrate 101 are provided. The gate structure 110 includes agate dielectric layer 120, a gate material layer 130, a middle spacer 140 and an outer spacer 150. The substrate 101 is usually a semiconductor material, such as Si. There are already some doping regions formed in the substrate 101, such as lightly doping region (LDD) 102 formed by a lightly doping procedure and a source/drain region 103 formed by a source/drain doping procedure, or both of the lightly doping region (LDD) 102 and the source/drain region 103.

The gate dielectric layer 120 is directly disposed on the substrate 101 and usually includes one or more insulating materials, such as silicon oxide, silicon nitride, silicon oxynitride, a high k material or a metal oxide. The gate material layer 130 is disposed on the gate dielectric layer 120 and usually includes a conductive material or a dummy material, such as poly Si and an optional hard mask material, silicon oxide and silicon oxide for example. The dummy material may be later replaced by a metal gate. The middle spacer 140 is adjacent to the gate dielectric layer 120 and the gate material layer 130. Further, it has an L-shaped cross section. In addition, an outer spacer 150 is also adjacent to the gate dielectric layer 120 and the gate material layer 130 and disposed on the middle spacer 140. In particular, the outer spacer 150 has a special sail-like cross section. Optionally, there may be an inner spacer 160 which is formed in the gate structure 110 and in direct contact with the gate material layer 130. The middle spacer 140, the outer spacer 150 and the inner spacer 160 may usually include different insulating materials, such as silicon oxide, silicon nitride and silicon oxynitride.

The middle spacer 140 and the outer spacer 150 may be formed as follows. First, a first spacer material layer (not shown) and a second spacer material layer (not shown) are deposited on the gate structure 110 and on the substrate 101 after the completion of the gate structure 110. Then an etching-back step is carried out to form the middle spacer 140 and the outer spacer 150 which surround the gate structure 110, and to make some of the substrate 101 exposed.

Due to the etching-back step on the outer spacer 150, the outer spacer 150 has a special sail-like cross section. In addition due to the same reason, the middle spacer 140 has an L-shaped cross section. In other words, the middle spacer 140 has a horizontal part 141 which contacts the substrate 101 and a vertical part 142, as shown in FIG. 1. However, the top surface 151 of the outer spacer 150 is still roughly as high as the top surface 131 of the gate material layer 130 to form a continuous joint surface. The method for making the gate structure 110 is well known in the art and the details will not be elaborated here.

Figure 2A:
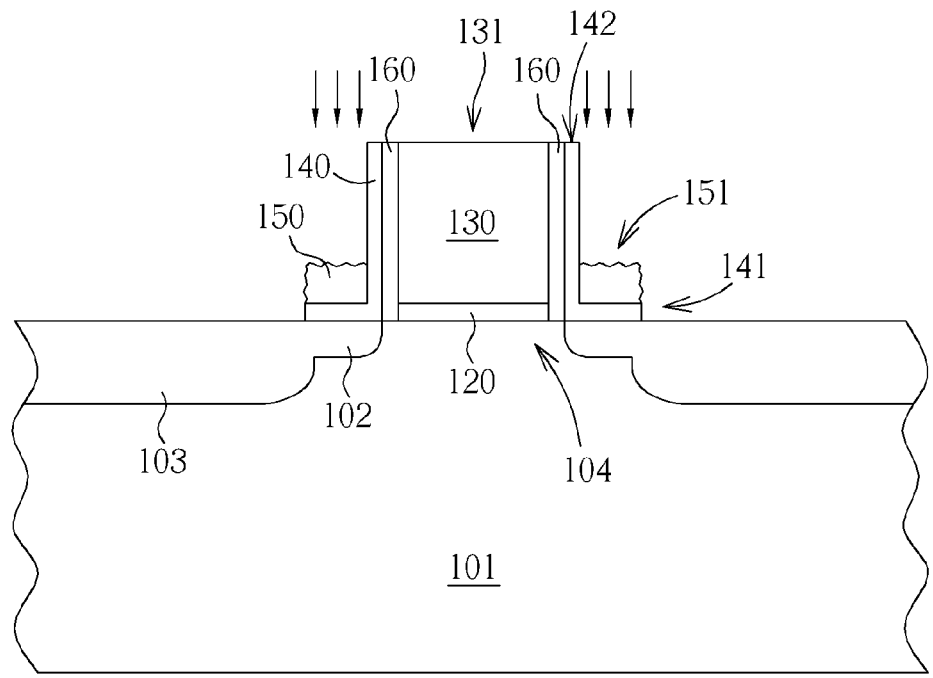

Second, please refer to FIG. 2A, an oxidative slimming procedure is carried out. The oxidative slimming procedure may include multiple steps to slim the height of the outer spacer without substantially slimming the width of the outer spacer so that the outer spacer eventually has a good rectangular cross section. For example, the oxidative slimming procedure may include two different steps. First, an oxidative procedure is carried out. For instance, an oxidizing agent may be used to perform on the exposed substrate 101, the middle spacer 140 and the outer spacer 150.

Second, a slimming procedure is carried out. For example, an etching agent is used to exclusively slim the outer spacer 150 with a special sail-like cross section as much as possible without substantially slimming the middle spacer 140 and the width of the outer spacer 150. Due to the double influence of both the doping step and the oxidative procedure (the doping step forms the lightly doping region (LDD) 102 or the source/drain region 103), the slimming procedure is only capable of exclusively slimming the outer spacer 150 as much as possible without substantially slimming the middle spacer 140 and the width of the outer spacer 150. In addition, the special cross section may not be in a prefect rectangular shape but the exposed two surfaces may be slightly curved due to the etchant. For example, the slimed width of the outer spacer may be one tenth to one fifth of the slimed height of the outer spacer. After the slimming procedure, the top surface 151 of the outer spacer 150 is discontinuously lower than the top surface 131 of the gate material layer 130, in order to form a discontinuous joint surface. Preferably, the width of the rectangular cross section is larger than the height of the rectangular cross section.

The oxidizing agent for use in the oxidative procedure may be a liquid or a gas. A liquid oxidizing agent may be aqueous hydrogen peroxide, or preferably a mixed solution of hydrogen peroxide and sulfuric acid (SPM). A gas oxidizing step may be an oxygen ashing step. The etching agent for use in the slimming procedure may also be a liquid or a gas. A liquid etching agent may be a wet etching agent. For example, a concentrated phosphoric acid may be used as the wet etching agent when the outer spacer 150 includes silicon nitride. A gas etching agent may be a dry etching agent.

Optionally, in one aspect the oxidative slimming procedure of the present invention may be integrated with other conventional semiconductor procedures. In another aspect the oxidative slimming procedure of the present invention may completely remove the outer spacer 150. Various examples will be described here to elaborate the diverse embodiments of the concept of the present invention.

The First Embodiment

Please refer to FIG. 1, in the first embodiment for making the semiconductor structure with the slimmed spacer of the present invention, first a substrate 101 and a gate structure 110 disposed on the substrate 101 are provided. The gate structure 110 includes a gate dielectric layer 120, a gate material layer 130, an optional inner spacer 160, a middle spacer 140 and an outer spacer 150. There are already some doping regions formed in the substrate 101, such as lightly doping region (LDD) 102 or a source/drain region 103, or both of the lightly doping region (LDD) 102 and the source/drain region 103. The middle spacer 140 is adjacent to the gate dielectric layer 120 and the gate material layer 130. Further, it has an L-shaped cross section. In addition, an outer spacer 150 is disposed on the middle spacer 140 and has a special sail-like cross section.

Second, please refer to FIG. 2A, an oxidative slimming procedure is carried out. The oxidative slimming procedure may include multiple steps to exclusively slim the height of the outer spacer 150 as much as possible without substantially slimming the width of the outer spacer 150 and simultaneously not slim the middle spacer 140 so that the outer spacer 150 eventually has a rectangular cross section. After the slimming procedure, the top surface 151 of the outer spacer 150 is discontinuously lower than the top surface 131 of the gate material layer 130, to form a discontinuous joint surface.

The oxidizing agent for use in the oxidative procedure may be a liquid or a gas. A liquid oxidizing agent may be aqueous hydrogen peroxide, or preferably a mixed solution of hydrogen peroxide and sulfuric acid (SPM). A gas oxidizing step may be an oxygen ashing step. The etching agent for use in the slimming procedure may also be a liquid or a gas. A liquid etching agent may be a wet etching agent. For example, a concentrated phosphoric acid may be used as the wet etching agent to effectively lower the vertical height of the outer spacer 150 when the middle spacer 140 includes silicon oxide and the outer spacer 150 includes silicon nitride.

Figure 3A:
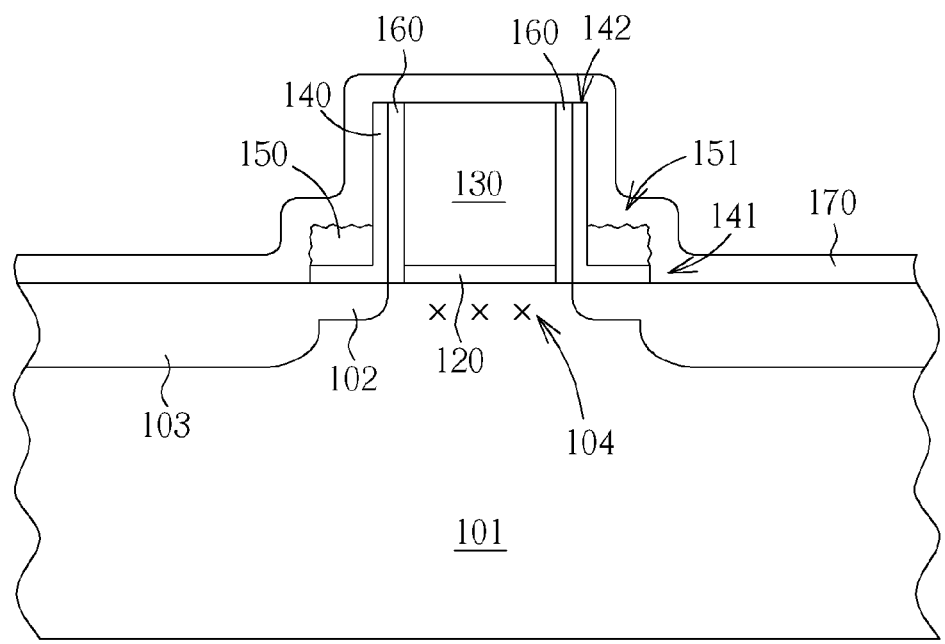

Next, please refer to FIG. 3A, a stress layer 170 is formed to cover the gate structure 110 and the outer spacer 150. The stress layer 170 may be a single layer structure or a composite layer structure. The composite layer structure may be a composite layer structure including an oxide and a nitride. Then, a stress of a suitable magnitude and property, such as a tensile stress or a compressive stress, is constructed in the substrate 101 under the gate structure 110, such as the gate channel 104, using the stress layer 170 by means of a stress memory technique (SMT) under RTA. Afterwards, the stress layer 170 may be removed to expose some of the substrate.

Figure 4A:
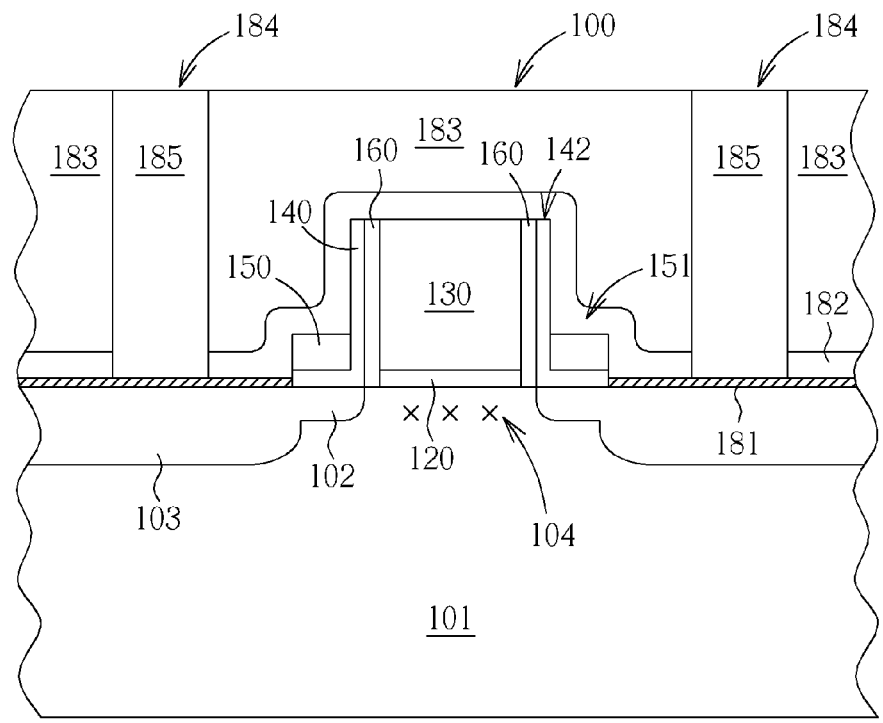
FIGS. 4A, 4B, 4C and 4D illustrate the semiconductor structure of the present invention.

Later, please refer to FIG. 4A, other conventional semiconductor procedures may be carried out after the oxidative slimming procedure of the present invention. For example, a layer of self-aligned silicide 181 is formed on the surface of the exposed substrate 101 after the stress layer 170 is removed. Then, a contact etching-stop layer (CESL) 182 is formed to cover the gate structure 110 and the substrate 101. Next, an interlayer dielectric layer 183 is formed to cover the contact etching-stop layer (CESL) 182. Following that, a contact hole 184 which penetrates the interlayer dielectric layer 183 and the contact etching-stop layer (CESL) 182 is formed. Later, a contact plug 185 which fills up the contact hole 184 may be formed to serve as the outward electric connection media for the source/drain 103 disposed under the interlayer dielectric layer 183.

The Second Embodiment

Please refer to FIG. 1, in the second embodiment for making the semiconductor structure with the slimmed spacer of the present invention, first a substrate 101 and a gate structure 110 disposed on the substrate 101 are provided. The gate structure 110 includes agate dielectric layer 120, a gate material layer 130, a middle spacer 140, an outer spacer 150 and an optional inner spacer 160. There are already some doping regions formed in the substrate 101, such as lightly doping region (LDD) 102 or a source/drain region 103, or both of the lightly doping region (LDD) 102 and the source/drain region 103. The middle spacer 140 is adjacent to the gate dielectric layer 120 and the gate material layer 130. Further, it has an L-shaped cross section. In addition, an outer spacer 150 is disposed on the middle spacer 140 and has a special sail-like cross section.

Figure 2B:
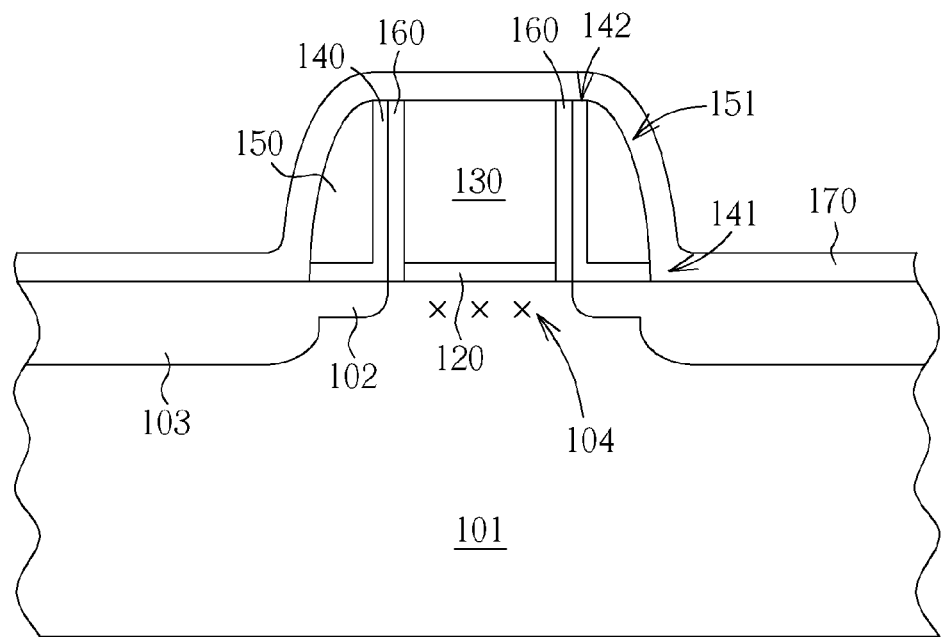
Figure 3B:
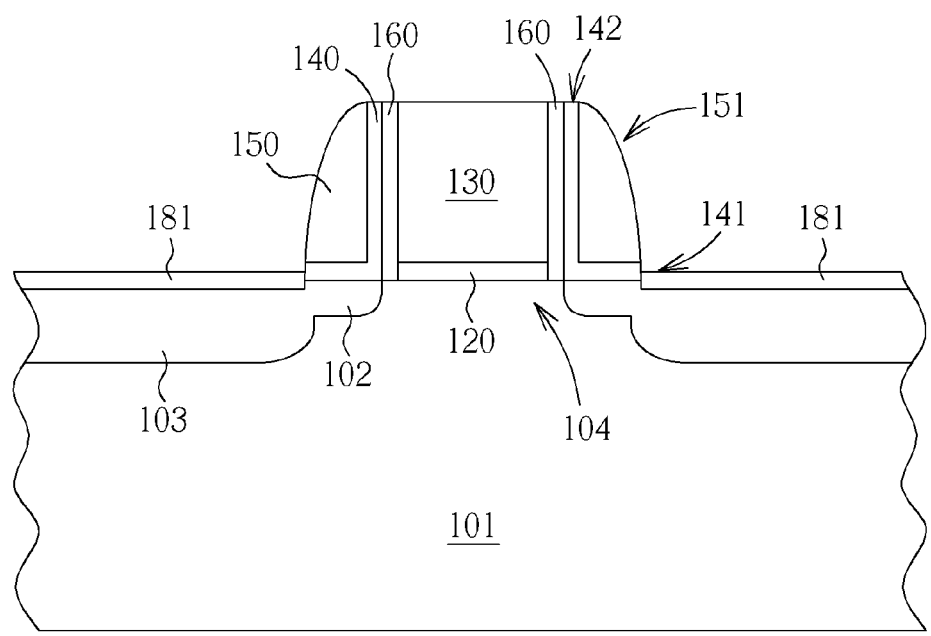

One of the major differences between the first embodiment and the second embodiment resides in that the stress memory technique (SMT) to form the stress layer 170 is carried out before the oxidative slimming procedure is carried out so that a stress of a suitable magnitude and property, such as a tensile stress or a compressive stress, is constructed in the substrate 101 under the gate structure 110, such as the gate channel 104, as shown in FIG. 2B. Then, the stress layer 170 may be removed to expose some of the substrate 101. Next, a layer of self-aligned silicide 181 is formed on the exposed surface of the substrate 101 after the stress layer 170 is removed, as shown in FIG. 3B.

Subsequently, the oxidative slimming procedure is carried out. The oxidative slimming procedure may include multiple steps to exclusively slim the outer spacer 150 with a special sail-like cross section as much as possible to result in a rectangular cross section without substantially slimming the width of the outer spacer 150 and simultaneously not slim the middle spacer 140. After the slimming procedure, the top surface 151 of the outer spacer 150 is discontinuously lower than the top surface 131 of the gate material layer 130, to form a discontinuous joint surface.

Figure 4B:
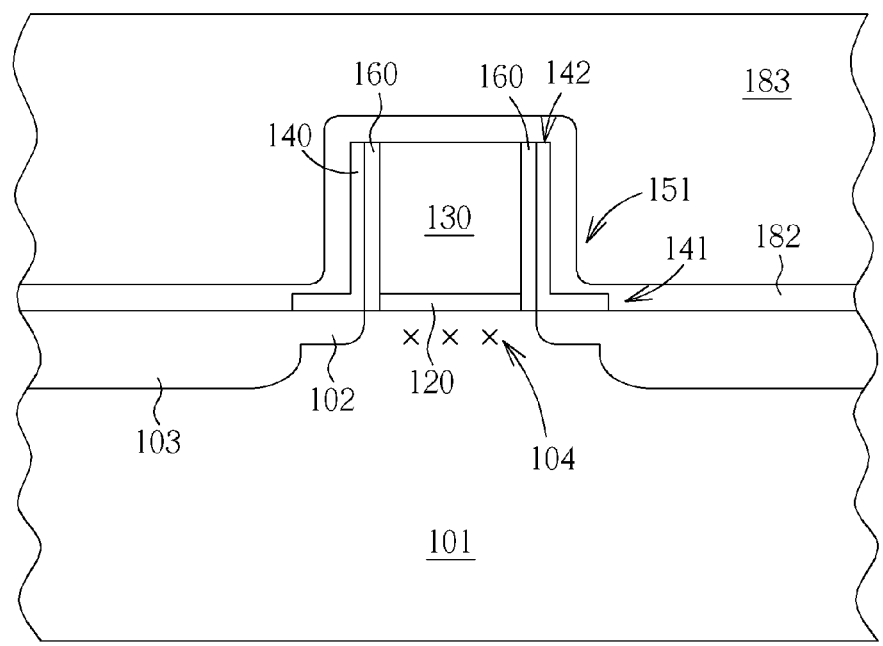

Later, please refer to FIG. 4B, other conventional semiconductor procedures may be carried out. For example, the aforesaid contact etching-stop layer (CESL) 182, the interlayer dielectric layer 183, the contact hole 184 which penetrates the interlayer dielectric layer 183 and the contact etching-stop layer (CESL) 182, and the contact plug 185 which fills up the contact hole 184 to serve as the outward electric connection media for the source/drain 103 under the interlayer dielectric layer 183.

The Third Embodiment

Please refer to FIG. 1, in the third embodiment for making the semiconductor structure with the slimmed spacer of the present invention, first a substrate 101 and a gate structure 110 disposed on the substrate 101 are provided. The gate structure 110 includes agate dielectric layer 120, a gate material layer 130, a middle spacer 140, an outer spacer 150 and an optional inner spacer 160. There are already some doping regions formed in the substrate 101, such as lightly doping region (LDD) 102 or a source/drain region 103, or both of the lightly doping region (LDD) 102 and the source/drain region 103. The middle spacer 140 is adjacent to the gate dielectric layer 120 and the gate material layer 130. Further, it has an L-shaped cross section. In addition, an outer spacer 150 is disposed on the middle spacer 140 and has a special sail-like cross section.

Figure 4C:
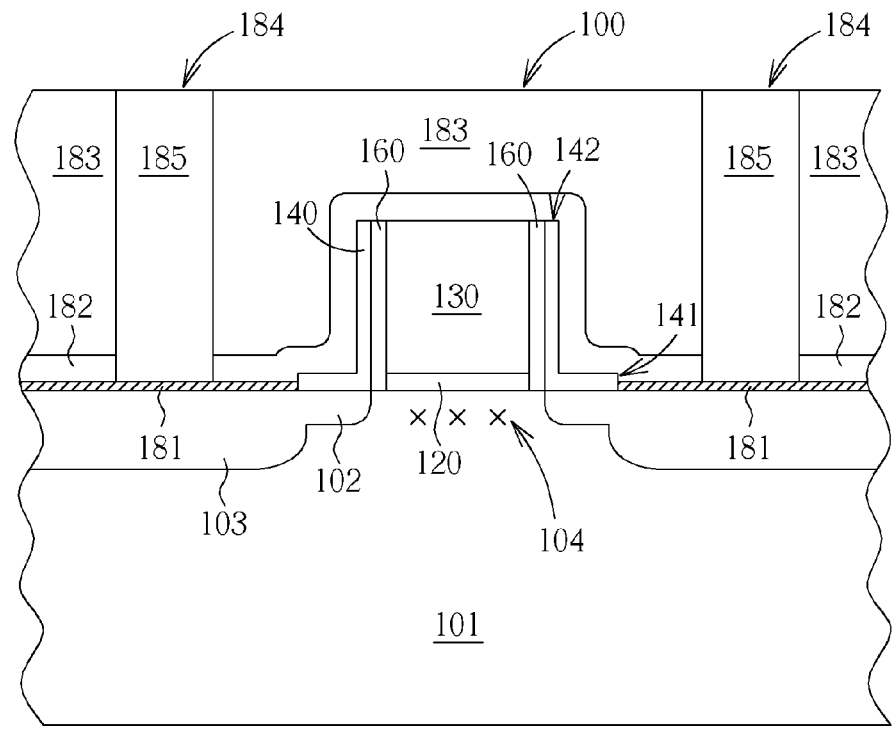
Figure 4D:
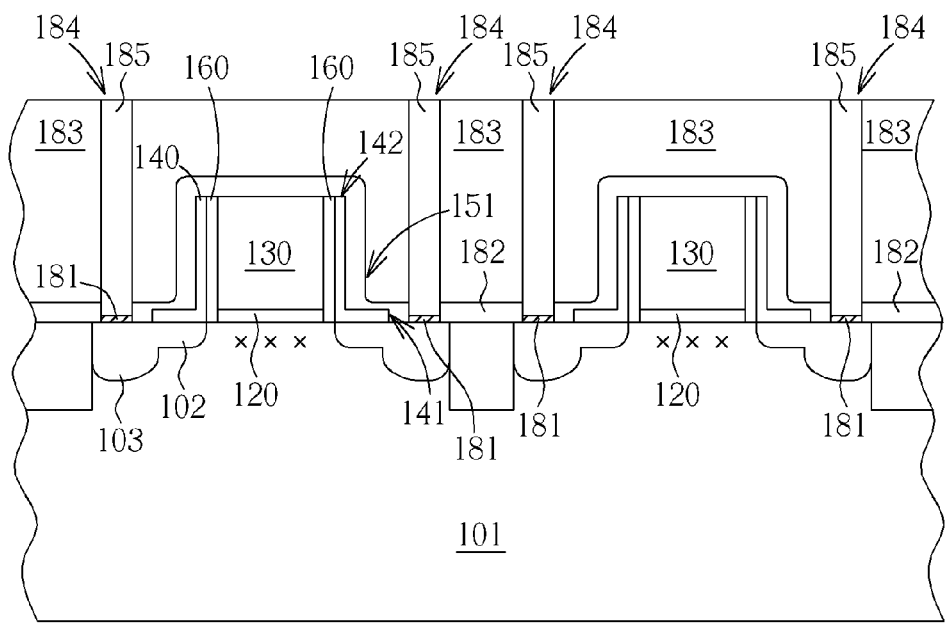

One of the major differences between the first embodiment and the third embodiment resides in that the outer spacer 150 with a rectangular cross section is first totally removed then other conventional semiconductor procedures proceed after the oxidative slimming procedure, the stress memory technique (SMT), and the formation of silicide 181. For example, the aforesaid contact etching-stop layer (CESL) 182, the interlayer dielectric layer 183, the contact hole 184 which penetrates the interlayer dielectric layer 183 and the contact etching-stop layer (CESL) 182, and the contact plug 185 which fills up the contact hole 184 to serve as the outward electric connection media for the source/drain 103 under the interlayer dielectric layer 183, as shown in FIG. 4C. In other words, the silicide 181 is formed on the surface of the substrate 101 before the outer spacer 150 with a rectangular cross section is totally removed. The outer spacer 150 with a rectangular cross section may be totally removed in a way like the oxidative slimming procedure.

The Fourth Embodiment

Please refer to FIG. 1, in the fourth embodiment for making the semiconductor structure with the slimmed spacer of the present invention, first a substrate 101 and a gate structure 110 disposed on the substrate 101 are provided. The gate structure 110 includes a gate dielectric layer 120, a gate material layer 130, a middle spacer 140, an outer spacer 150 and an optional inner spacer 160. There are already some doping regions formed in the substrate 101, such as lightly doping region (LDD) 102 or a source/drain region 103, or both of the lightly doping region (LDD) 102 and the source/drain region 103. The middle spacer 140 is adjacent to the gate dielectric layer 120 and the gate material layer 130. Further, it has an L-shaped cross section. In addition, an outer spacer 150 is disposed on the middle spacer 140 and has a special sail-like cross section.

One of the major differences between the fourth embodiment and the other embodiments resides in that the formation of the silicide 181 is carried out after the completion of the contact holes 184. In other words, the oxidative slimming procedure as shown in FIG. 2A, the stress memory technique (SMT), the total removal of the outer spacer 150 with a rectangular cross section, the formation of the contact etching-stop layer (CESL) 182, the formation of interlayer dielectric layer 183 to cover the contact etching-stop layer (CESL) 182 as shown in FIG. 4B are sequentially carried out in advance.

As a result, different from other embodiments the silicide 181 only appears in the contact holes 184 but not in any other places. Later, the contact plugs 185 which fill up the contact hole 184 are formed to serve as the outward electric connection media for the source/drain 103 under the interlayer dielectric layer 183, so that the silicide 181 is sandwiched between the contact plugs 185 and the source/drain regions 103, as shown in 4D.

After the various embodiments of the method for lowering the height of a spacer of the present invention, a semiconductor structure 100 is accordingly obtained. Please refer to FIGS. 4A, 4B and 4D, which illustrates the semiconductor structures of the present invention. The semiconductor structure 100 of the present invention includes a substrate 101 and a gate structure 110 disposed on the substrate 101. The gate structure 110 includes a gate dielectric layer 120, a gate material layer 130, a middle spacer 140 which is adjacent to the gate dielectric layer 120 and the gate material layer 130 and has an L-shaped cross section, and an outer spacer 150 with a rectangular cross section, an optional inner spacer 160 which is in direct contact with the gate dielectric layer 120 and the gate material layer 130, a set of source and drain 103, an interlayer dielectric layer 183 and some contact plugs 185.

The gate dielectric layer 120 is directly disposed on the substrate 101 and usually includes one or more insulating materials, such as silicon oxide, silicon nitride, silicon oxynitride, a high k material or a metal oxide. The gate material layer 130 is disposed on the gate dielectric layer 120 and usually includes a conductive material or a dummy material, such as Si. The dummy material may be later replaced by a metal gate. The top surface 151 of the outer spacer 150 with a rectangular cross section is discontinuously lower than the top surface 131 of the gate material layer 130. The middle spacer 140, the outer spacer 150 and the inner spacer 160 may usually include different insulating materials, such as silicon oxide, silicon nitride and silicon oxynitride.

A pair of source and drain 103 is disposed in the substrate 101 and adjacent to the outer spacer 150. The interlayer dielectric layer 183 simultaneously covers the substrate 101, the gate structure 110 and the source and drain 103. The contact plug 185 which fill up the contact hole 184 penetrates the interlayer dielectric layer 183 to respectively electrically connect to the source/drain 103 and the gate structure 110.

Please note that the width of the outer spacer 150 in the semiconductor structure 100 of the present invention is by far greater than the height of itself. Preferably, the lower the height, the better, or the height may barely exist. In addition, there is a suitable stress, such as a tensile stress or a compressive stress, in the gate channel 104 underlying the gate structure 110 in the substrate 101.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for lowering the height of a spacer, comprising:
    providing a gate structure disposed on a substrate, said gate structure comprising:
        a gate dielectric layer disposed on said substrate;
        a gate material layer disposed on said gate dielectric layer; and
        an outer spacer with a sail-like cross section and adjacent to said gate dielectric layer and said gate material layer; and
    performing an oxidative slimming procedure to slim the height of said outer spacer without substantially slimming the width of said outer spacer to make said outer spacer have a rectangular cross section, wherein the width of said rectangular cross section is larger than the height of said rectangular cross section.

2. The method for lowering the height of a spacer of claim 1, wherein said oxidative slimming procedure involves at least one of a wet etching step and a dry etching step.

3. The method for lowering the height of a spacer of claim 1, wherein said oxidative slimming procedure involves at least one of a mixture of hydrogen peroxide and sulfuric acid, and an oxygen ashing step.

4. The method for lowering the height of a spacer of claim 1, wherein the slimed width of said outer spacer is one tenth less than the slimed height of said outer spacer.

5. The method for lowering the height of a spacer of claim 1, before said oxidative slimming procedure further comprising:
    forming an inner spacer in direct contact with said gate material layer;
    performing a lightly doping procedure to form a lightly doping region (LDD) in said substrate;
    forming a middle spacer adjacent to said gate dielectric layer and said gate material layer and with an L cross section; and
    performing a source/drain doping procedure to form a source/drain region in said substrate.

6. The method for lowering the height of a spacer of claim 1, after said oxidative slimming procedure further comprising:
    forming a stress layer to cover said gate structure and said outer spacer;
    constructing a stress in said substrate under said gate structure by means of said stress layer; and
    removing said stress layer.

7. The method for lowering the height of a spacer of claim 6, further comprising:
    forming a silicide on said substrate before removing said outer spacer with said rectangular cross section.

8. The method for lowering the height of a spacer of claim 1, before said oxidative slimming procedure further comprising:
    forming a stress layer to cover said gate structure and said outer spacer;
    constructing a stress in said substrate under said gate structure by means of said stress layer; and
    removing said stress layer.

9. The method for lowering the height of a spacer of claim 1, after said oxidative slimming procedure further comprising:
    forming a contact etch-stop layer to cover said gate structure;
    forming an interlayer structure to cover said contact etch-stop layer; and
    forming a contact plug to electrically connect a source/drain region under said interlayer structure.

10. The method for lowering the height of a spacer of claim 9, further comprising:
    removing said outer spacer with said rectangular cross section before forming said contact etch-stop layer; and
    forming a silicide on said substrate after a contact hole is formed for accommodating said contact plug.

11. The method for lowering the height of a spacer of claim 9, before forming said contact etch-stop layer further comprising:
    forming a silicide on said substrate; and
    removing said outer spacer with said rectangular cross section.

12. The method for lowering the height of a spacer of claim 1, wherein the top surface of said outer spacer is lower than the top surface of said gate material layer.

13. The method for lowering the height of a spacer of claim 12, wherein the top surface of said outer spacer is discontinuously lower than the top surface of said gate material layer.

\* \* \* \* \*